(12) United States Patent
Kuramochi et al.

(10) Patent No.: US 7,609,184 B2
(45) Date of Patent: Oct. 27, 2009

(54) D-A CONVERT APPARATUS AND A-D CONVERT APPARATUS

(75) Inventors: Yasuhide Kuramochi, Tokyo (JP); Akira Matsuzawa, Tokyo (JP)

(73) Assignees: Advantest Corporation, Tokyo (JP); Tokyo Institute of Technology, Tokyo (JP)

( * ) Notice: Subject to any disclaimer, the term of this patent is extended or adjusted under 35 U.S.C. 154(b) by 68 days.

(21) Appl. No.: 11/937,491

(22) Filed: Nov. 8, 2007

(65) Prior Publication Data
US 2009/0121907 A1    May 14, 2009

(51) Int. Cl.
*H03M 1/06* (2006.01)
(52) U.S. Cl. .............. 341/118; 341/120; 341/144; 341/150; 341/163; 341/172
(58) Field of Classification Search .............. 341/118, 341/156, 163, 172
See application file for complete search history.

(56) References Cited

U.S. PATENT DOCUMENTS

| | | | | | |
|---|---|---|---|---|---|
| 4,399,426 | A | * | 8/1983 | Tan | 341/120 |
| 4,709,225 | A | * | 11/1987 | Welland et al. | 341/121 |
| 4,999,633 | A | * | 3/1991 | Draxelmayr | 341/120 |
| 6,686,865 | B2 | * | 2/2004 | Confalonieri et al. | 341/172 |
| 2007/0132626 | A1 | | 6/2007 | Hurrell | |

* cited by examiner

*Primary Examiner*—Khai M Nguyen
(74) *Attorney, Agent, or Firm*—Osha • Liang LLP

(57) ABSTRACT

Provided is a D-A conversion apparatus that outputs an analog output voltage according to digital input data, which includes a capacitance array main D-A converter that supplies a main voltage according to the input data to an output terminal of the D-A conversion apparatus, a correction data output section that outputs correction data according to the input data, a capacitance array correction D-A converter that outputs a correction voltage according to the correction data, and a voltage dividing capacitor connected serially between an output end of the correction D-A converter and an output end of the main D-A converter.

13 Claims, 14 Drawing Sheets

| BIT LOCATION | CORRECTION DATA OF EVERY BIT (2 DECIMAL POINTS) |
|---|---|
| D12 | 101 |
| D11 | 100 |
| D10 | 111 |
| D9 | 001 |
| D8 | 101 |
| D7 | 010 |
| D6 | 000 |
| D5 | 000 |
| D4 | 000 |
| D3 | 000 |
| D2 | 000 |
| D1 | 000 |

D12–D7: CORRECTION TARGET BITS

FIG. 7

| BIT LOCATION | VALUE OF THE COMPARISON DATA D$_R$ | CORRECTION VALUE FOR EACH BIT |
|---|---|---|
| D12 | 1 | 101 |
| D11 | 0 | 0 |
| D10 | 1 | 111 |
| D9 | 1 | 001 |
| D8 | 0 | 0 |
| D7 | 1 | 010 |
| D6 | 0 | 0 |
| D5 | 1 | 0 |
| D4 | 1 | 0 |
| D3 | 1 | 0 |
| D2 | 0 | 0 |
| D1 | 0 | 0 |

CUMULATIVE ADDITION RESULT (=CORRECTION DATA) ↓ CUMULATIVE ADDITION

| VALUE OF THE CORRECTION TARGET BIT | CORRECTION DATA |
|---|---|
| 111111 | 11000 |
| 111110 | 10110 |
| 111101 | 10011 |
| 111100 | 10001 |
| 111011 | 10111 |
| ⋮ | ⋮ |
| 000011 | 111 |
| 000010 | 101 |
| 000001 | 10 |
| 000000 | 0 |

*FIG. 9*

D-A CONVERT APPARATUS AND A-D CONVERT APPARATUS

BACKGROUND

1. Technical Field

The present invention relates to a D-A conversion apparatus and an A-D conversion apparatus. More particularly, the present invention relates to a D-A conversion apparatus that outputs an analog output voltage according to digital input data and to an A-D conversion apparatus provided with the D-A conversion apparatus.

2. Related Art

A charge redistribution A-D conversion apparatus is known as in, for example, US Unexamined Patent Application Publication US2007/0132626. The A-D conversion apparatus described in the above publication is provided with a capacitance array main D-A converter, a capacitance array correction D-A converter, a comparator, and a control logic.

The main D-A converter outputs an analog voltage according to data supplied from the control logic. The correction D-A converter is supplied with data expressing a resolution of the main D-A converter that is less than 1 LSB from the control logic and outputs an analog voltage according to the supplied data. The comparator compares an input voltage to a sum voltage obtained by adding the voltage output from the main D-A converter to the voltage output from the correction D-A converter.

The control logic changes the data supplied to the main D-A converter and the correction D-A converter in order to search for data through which the input voltage and the sum voltage are identical. The control logic then outputs the data through which the input voltage and the sum voltage are identical to an external section.

Here, the control logic supplies data that is corrected according to DNL (Differential Non Linearity) of the main D-A converter to the main D-A converter and the correction D-A converter. More specifically, the control logic supplies integer portions of the data corrected according to the DNL to the main D-A converter. Furthermore, the control logic supplies fractional portions of the data corrected according to the DNL to the correction D-A converter. Therefore, the A-D conversion apparatus described in US Unexamined Patent Application Publication US2007/0132626 can output voltage corrected by the DNL with a degree of precision less than 1 LSB.

The capacitance array D-A converter that outputs a voltage having a resolution less than 1 LSB (for example, 0.5 LSB, 0.25 LSB, . . . ) has a capacitor with a minimum unit capacitance smaller than that of a capacitor of a D-A converter that outputs a voltage having a resolution greater than or equal to 1 LSB. However, because the minimum capacitance of a capacitor that can be manufactured on a semiconductor is determined by a manufacturing process of the semiconductor, the capacitance array D-A converter that outputs a voltage having a resolution less than 1 LSB has an enlarged synthetic capacitance, which results in a lowered band. Accordingly, it is desirable that the capacitance array D-A converter have a capacitor with a larger minimum unit capacitance.

Furthermore, in a case where the voltage corrected by the DNL is output from the D-A converter, it is necessary that a measurement device be connected to the D-A converter from the outside to measure the DNL in advance, and the correction data according to a measurement result must be written onto an internal memory of the D-A converter. Accordingly, it is difficult for the D-A converter to easily adjust the correction data.

SUMMARY

Therefore, it is an object of an aspect of the present invention to provide a D-A conversion apparatus and an A-D conversion apparatus, which are capable of overcoming the above drawbacks accompanying the related art. The above and other objects can be achieved by combinations described in the independent claims. The dependent claims define further advantageous and exemplary combinations of the present invention.

According to a first embodiment of the present invention, a D-A conversion apparatus is provided that outputs an analog output voltage according to digital input data. The D-A conversion apparatus includes a capacitance array main D-A converter that supplies a main voltage according to the input data to an output terminal of the D-A conversion apparatus, a correction data output section that outputs correction data according to the input data, a capacitance array correction D-A converter that outputs a correction voltage according to the correction data, and a voltage dividing capacitor connected serially between an output end of the correction D-A converter and an output end of the main D-A converter.

According to a second embodiment of the present invention, a D-A conversion apparatus is provided that outputs an analog output voltage according to digital input data. The D-A conversion apparatus includes a main D-A converter that supplies a main voltage according to the input data to an output terminal of the D-A conversion apparatus, a correction data output section that outputs correction data according to the input data, a correction D-A converter that outputs a correction voltage according to the correction data, an adding section that adds the correction voltage to the main voltage, and a calibration section that determines the correction data during calibration based on a result obtained by using the correction D-A converter to A-D convert the main voltage output by the main D-A converter.

According to a third embodiment of the present invention, an A-D conversion apparatus is provided that outputs digital output data according to an analog input voltage. The A-D conversion apparatus includes a D-A conversion apparatus that outputs a comparison voltage according to digital comparison data; a comparator that outputs a comparison result obtained by comparing the input voltage to the comparison voltage; and a control section that changes the comparison data supplied to the D-A conversion apparatus in order to detect the comparison data through which the input voltage and the comparison voltage are the same, and outputs the detected comparison data as the output data. In the A-D conversion apparatus, the D-A conversion apparatus includes a capacitance array main D-A converter that supplies a main voltage according to the comparison data to an output terminal of the D-A conversion apparatus, a correction data output section that outputs correction data according to the comparison data, a capacitance array correction D-A converter that outputs a correction voltage according to the correction data, and a voltage dividing capacitor connected serially between an output end of the correction D-A converter and an output end of the main D-A converter.

According to a fourth embodiment of the present invention, an A-D conversion apparatus is provided that outputs digital output data according to an analog input voltage. The A-D conversion apparatus includes a D-A conversion apparatus that outputs a comparison voltage according to digital comparison data; a comparator that outputs a comparison result obtained by comparing the input voltage to the comparison voltage; and a control section that changes the comparison data supplied to the D-A conversion apparatus in order to detect the comparison data through which the input voltage and the comparison voltage are the same, and outputs the detected comparison data as the output data. In the A-D conversion apparatus, the D-A conversion apparatus includes a main D-A converter that supplies a main voltage according to the comparison data to an output terminal of the D-A conversion apparatus, a correction data output section that outputs correction data according to the comparison data, a correction D-A converter that outputs a correction voltage according to the correction data, an adding section that adds the correction voltage to the main voltage, and a calibration section that determines the correction data during calibration based on a result obtained by A-D converting the main voltage output by the main D-A converter by means of the correction D-A converter.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 7 shows an example of correction data of each bit stored by a memory 72.

FIG. 8 shows an example of a cumulative addition process by a correction data generating section 74.

FIG. 9 shows an example of correction data stored in the memory 72.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
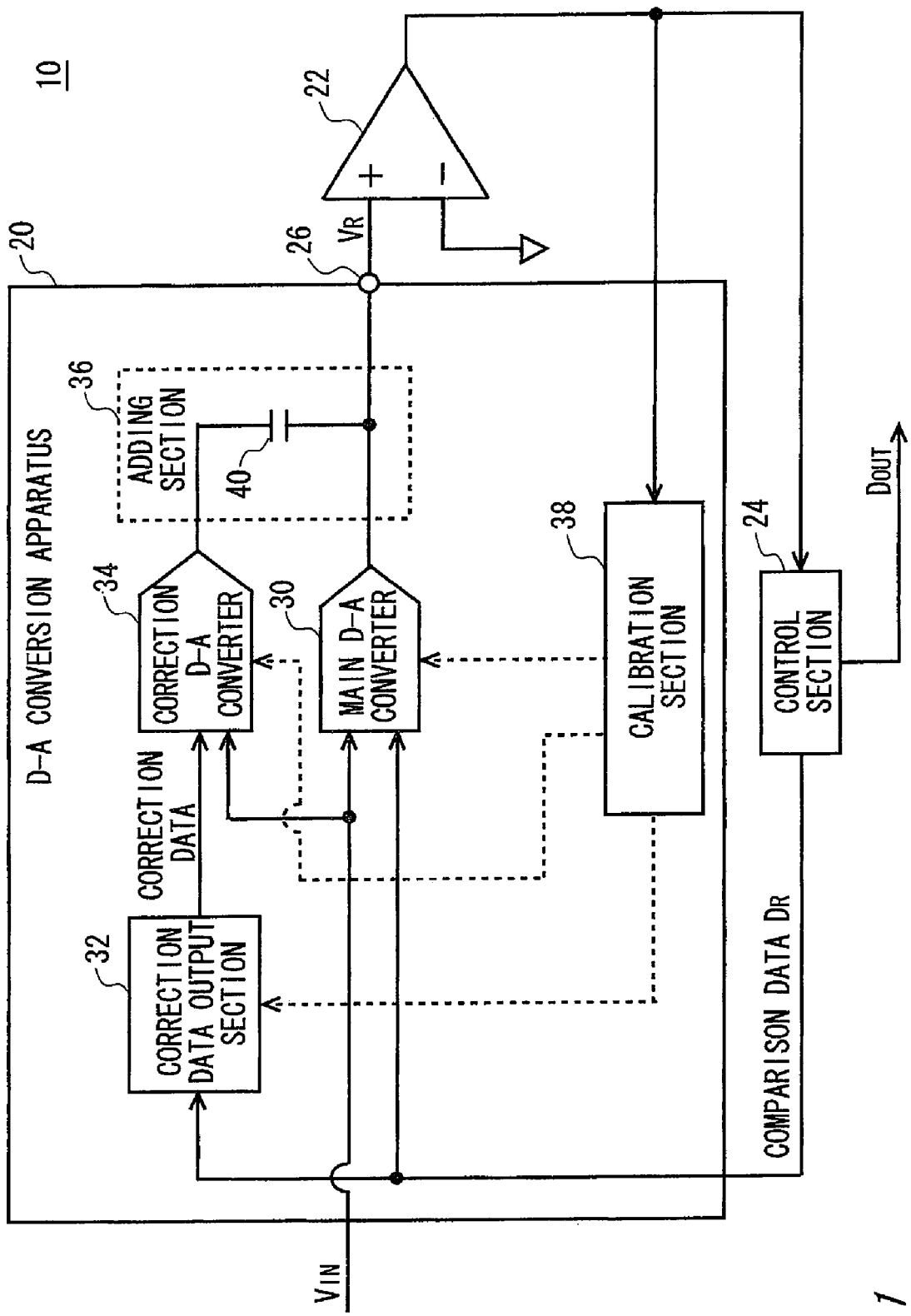
FIG. 1 shows a configuration of an A-D conversion apparatus 10 according to the present embodiment.

FIG. 1 shows a configuration of an A-D conversion apparatus 10 according to the present embodiment. The A-D conversion apparatus 10 outputs digital output data $D_{OUT}$, which has a prescribed number of bits, according to an analog input voltage $V_{IN}$.

The A-D conversion apparatus 10 is provided with a D-A conversion apparatus 20, a comparator 22, and a control section 24. The D-A conversion apparatus 20 outputs an analog comparison voltage $V_R$ according to digital comparison data DR supplied from the control section 24.

In the present embodiment, the D-A conversion apparatus 20 includes charge redistribution D-A converters. The D-A conversion apparatus 20 repeats sampling and holding in sync with a sampling period. During sampling, the D-A conversion apparatus 20 samples the input voltage $V_{IN}$. During holding, the D-A conversion apparatus 20 holds the sampled input voltage $V_{IN}$. Also during holding, the D-A conversion apparatus 20 is supplied with the comparison data DR from the control section 24 and outputs from an output terminal 26 a voltage obtained by subtracting the sampled input voltage $V_{IN}$ from the comparison voltage $V_R$.

The comparator 22 compares the output voltage output from the output terminal 26 of the D-A conversion apparatus 20 to a common potential and outputs the comparison result. Therefore, the comparator 22 can output a comparison result obtained by comparing the input voltage $V_{IN}$ to the comparison voltage $V_R$. For example, the comparator 22 may output as the comparison result a logic value that indicates which is larger between the input voltage $V_{IN}$ and the comparison voltage $V_R$.

The control section 24, during holding of the input voltage $V_{IN}$, supplies to the D-A conversion apparatus 20 the comparison data $D_R$ that has, for example, the same number of bits as the output data $D_{OUT}$. The control section 24 changes the comparison data $D_R$ and detects comparison data $D_R$ in which the input voltage $V_{IN}$ and the comparison voltage $V_R$ are identical based on a comparison result by the comparator 22 of each value of the changed comparison data $D_R$. For example, the control section 24 may sequentially change the comparison data $D_R$ according to a successive approximation process in order to detect comparison data $D_R$ through which the input voltage $V_{IN}$ and the comparison voltage $V_R$ are identical.

For example, the control section 24 may detect, as the comparison data $D_R$ through which the input voltage $V_{IN}$ and the comparison voltage $V_R$ are identical, comparison data $D_R$ in which a maximum comparison voltage $V_R$ that is less than or equal to the input voltage $V_{IN}$ is generated or comparison data $D_R$ in which a minimum comparison voltage $V_R$ that is greater than or equal to the input voltage $V_{IN}$ is generated. The control section 24 described above then outputs the detected comparison data $D_R$ as the output data $D_{OUT}$.

In the manner described above, the A-D conversion apparatus 10 can convert the analog input voltage $V_{IN}$ into the digital output data $D_{OUT}$. In addition, the A-D conversion apparatus 10 described above can convert the analog voltage signal into a digital data string by repeating the conversion for every sampling cycle.

Next, the D-A conversion apparatus 20 will be described in greater detail. The D-A conversion apparatus 20 includes a main D-A converter 30, a correction data output section 32, a correction D-A converter 34, an adding section 36, and a calibration section 38.

The main D-A converter 30 is supplied with the comparison data $D_R$ as input data from the control section 24. The main D-A converter 30 outputs a main voltage according to the supplied comparison data $D_R$. The main D-A converter 30 may be, for example, a capacitance array D-A converter that internally includes a capacitor ladder circuit. The main D-A converter 30 supplies the main voltage to the output terminal 26 of the D-A conversion apparatus.

In the present embodiment, the main D-A converter 30 may be a charge redistribution D-A converter that includes a sample/hold function. During sampling, the main D-A converter 30 samples the input voltage $V_{IN}$ by acquiring in the capacitor ladder circuit a charge according to the input voltage $V_{IN}$. Then, during holding, the main D-A converter 30 holds the input voltage $V_{IN}$ by not releasing the charge acquired in the capacitor ladder circuit to the outside. Also during holding, the main D-A converter 30 receives the comparison data $D_R$ from the control section 24 and outputs the main voltage obtained by subtracting the input voltage $V_{IN}$ from the voltage according to the comparison data $D_R$.

The correction data output section 32 is supplied with the comparison data $D_R$ from the control section 24. The correction data output section 32 outputs correction data according to the supplied comparison data $D_R$. For example, the correction data output section 32 may output correction data according to a voltage (correction voltage) that cancels out an error voltage (linearity error) between the ideal output voltage according to the comparison data $D_R$ and the actual output voltage of the main D-A converter 30 in a case where the comparison data $D_R$ is supplied.

For example, the correction data output section 32 may output correction data that includes bits that indicate weighting corresponding to lower bits of the comparison data $D_R$. The correction data output section 32 may, for example, output correction data that also includes bits that indicate weighting of fractions of the comparison data $D_R$. In other words, the correction data output section 32 may output correction data that includes bits that indicate precision corresponding to lower bits of the comparison data $D_R$ (1 LSB, 2 LSB, 4 LSB, ...) and bits that indicate precision smaller than the least significant bit (LSB) of the comparison data $D_R$ (0.5 LSB, 0.25 LSB, ...).

The correction D-A converter 34 is supplied with the correction data from the correction data output section 32. The correction D-A converter 34 outputs a correction voltage according to the supplied correction data. The correction D-A converter 34 may be a capacitance array D-A converter that internally includes a capacitor ladder circuit, for example.

In the present embodiment, the correction D-A converter 34 may be a charge redistribution D-A converter that includes a sample/hold function. During sampling, the correction D-A converter 34 samples the input voltage $V_{IN}$ by acquiring in the internal capacitor ladder circuit a charge according to the input voltage $V_{IN}$. Then, during holding, the correction D-A converter 34 holds the input voltage $V_{IN}$ by not releasing the charge acquired in the capacitor ladder circuit to the outside. Also during holding, the correction D-A converter 34 receives the correction data from the correction data output section 32 and outputs the correction voltage obtained by subtracting the input voltage $V_{IN}$ from the voltage according to the correction data.

The adding section 36 adds the correction voltage output from the correction D-A converter 34 to the main voltage output from the main D-A converter 30. The adding section 36 may include a voltage dividing capacitor 40, for example. The voltage dividing capacitor 40 is serially connected between the output end of the correction D-A converter 34 and the output end of the main D-A converter 30.

Here, the correction voltage output by the correction D-A converter 34 is serially divided by the synthetic capacitance of the correction D-A converter 34 and the capacitance of the voltage dividing capacitor 40 and added to the output end of the main D-A converter 30. For example, where the synthetic capacitance of the correction D-A converter 34 is set as Cx, the capacitance of the voltage dividing capacitor 40 is set as Cs2, and the correction voltage output by the correction D-A converter 34 is set as Vc, a voltage of $[Vc \times \{Cs2/(Cx+Cs2)\}]$ is applied to the output end of the main D-A converter 30. Therefore, the correction D-A converter 34 can add the voltage obtained by dividing the generated correction voltage by a prescribed dividing ratio to the main voltage output by the main D-A converter 30.

The synthetic capacitance of the correction D-A converter 34 and the voltage dividing capacitor 40 may be equal to, for example, the synthetic capacitance of the correction D-A converter 34 multiplied by two raised to a power. For example, where the synthetic capacitance of the correction D-A converter 34 and the voltage dividing capacitor 40 is $2^x$ times the synthetic capacitance of the correction D-A converter 34, the voltage dividing capacitor 40 can add to the main voltage the voltage output by the correction D-A converter 34 in a case where data lowered by X bits is received. The voltage dividing capacitor 40 described above can add to the main voltage the correction voltage according to the correction data represented with a fractional precision in relation to the comparison data $D_R$ without causing the minimum unit capacitance of the correction D-A converter 34 to be less than the minimum unit capacitance of the correction D-A converter 34.

During calibration executed prior to the A-D conversion process, the calibration section 38 determines the correction data output by the correction data output section 32 according to the comparison data $D_R$. In such a case, the calibration section 38 sets the correction data based on a result obtained by using the correction D-A converter 34 to A-D convert the main voltage output by the main D-A converter 30.

More specifically, the calibration section 38 sets the main D-A converter 30 in a manner to output a prescribed voltage. With the main D-A converter 30 set in such a manner, the calibration section 38, based on a comparison result obtained by comparing the output voltage of the output terminal 26 of the D-A conversion apparatus 20 to the prescribed voltage, adjusts the correction data to have a value that causes the output voltage to be identical to the prescribed voltage.

The calibration section 38, for example, supplies search data instead of the correction data to the correction D-A converter 34, changes the search data supplied to the correction D-A converter 34 in order to detect search data through which the output voltage and the prescribed voltage are identical based on a comparison result by the comparator 22 at each value of the changed search data. The calibration section 38 may then designate the detected search data as correction data having a value that causes the output voltage to be identical to the prescribed voltage. The calibration section 38 may, for example, sequentially change the search data according to a successive approximation process in order to detect search data through which the output voltage and the prescribed voltage are identical. The calibration section 38 described above can identify correction data that can set the output voltage of the output terminal 26 of the D-A conversion apparatus 20 to be the ideal output voltage according to the comparison voltage $D_R$.

The D-A conversion apparatus 20 described above outputs from the correction D-A converter 34 a correction voltage having a precision smaller than the least significant bit (LSB)

of the main D-A converter 30 (0.5 LSB, 0.25 LSB, . . . ). Therefore, through the D-A conversion apparatus 20, an analog voltage in which the linearity is accurately corrected can be output.

Furthermore, because the correction D-A converter 34 adds the correction voltage in parallel to the output end of the main D-A converter 30, the D-A conversion apparatus 20 can perform linearity correction with a wide dynamic range, even without digitally correcting the comparison data supplied to the main D-A converter 30. Therefore, through the D-A conversion apparatus 20, the analog voltage in which the linearity is corrected can be output at a high speed.

Furthermore, because the D-A conversion apparatus 20 is provided with a voltage dividing capacitor 40, the minimum unit capacitance of the capacitor ladder circuit of the correction D-A converter 34 can be set to be the same as (or greater than) the minimum unit capacitance of the main D-A converter 30. Therefore, through the D-A conversion apparatus 20, the minimum unit capacitance of the main D-A converter 30 can be enlarged.

Here, the main D-A converter 30 and the correction D-A converter 34 may be configured in a manner to not include the sample/hold function. In other words, the main D-A converter 30 and the correction D-A converter 34 may be configured in a manner to output the comparison voltage $V_R$ according to the comparison data $D_R$ without being provided with the input voltage $V_{IN}$. In such a case, the A-D conversion apparatus 10 is further provided with a sample/hold circuit that samples and holds the input voltage $V_{IN}$ and a subtracting section. The subtracting section supplies to the comparator 22 a voltage obtained by subtracting the input voltage $V_{IN}$ sampled by the sample/hold circuit from the comparison voltage $V_R$ output from the D-A conversion apparatus 20. Therefore, in the same manner as the case shown in FIG. 1, the comparator 22 can output the comparison result obtained by comparing the input voltage $V_{IN}$ to the comparison voltage $V_R$.

Furthermore, even in a case where the main D-A converter 30 and the correction D-A converter 34 have the sample/hold function, the A-D conversion apparatus 10 may be further provided with a separate sample/hold circuit. In such a case, the A-D conversion apparatus 10 may be provided with the sample/hold circuit that samples and holds the input voltage $V_{IN}$ at a stage prior to the D-A conversion apparatus 20.

Figure 2:
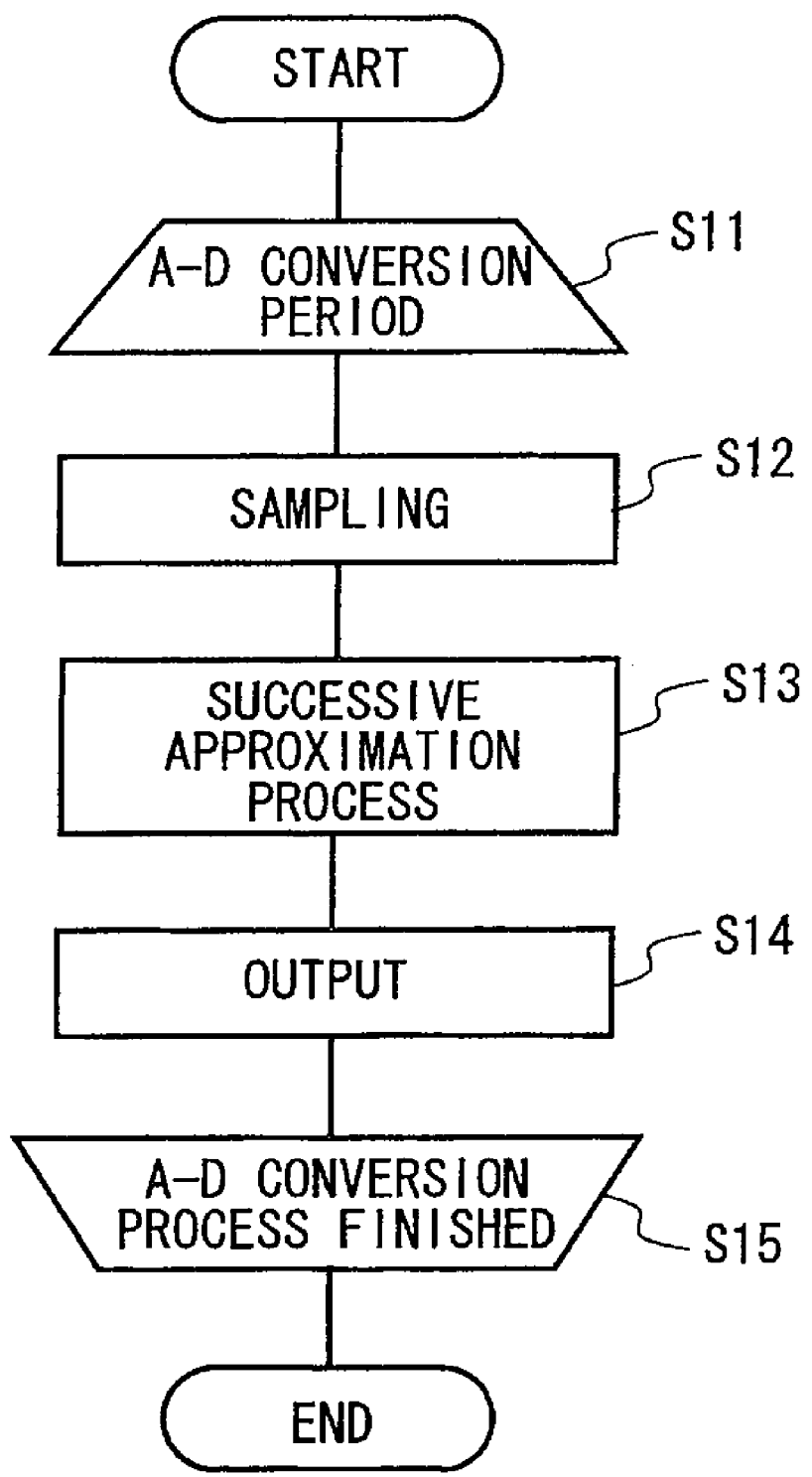
FIG. 2 shows a flow of an A-D conversion process by the A-D conversion apparatus 10.

FIG. 2 shows a flow of an A-D conversion process by the A-D conversion apparatus 10. The A-D conversion apparatus 10 repeatedly performs the processes of step S12 to step S14 for every A-D conversion cycle (sampling cycle) (S11, S15).

First, the A-D conversion apparatus 10 samples the input voltage $V_{IN}$ (S12). In the present embodiment, the main D-A converter 30 and the correction D-A converter 34 acquire the charge according to the input voltage $V_{IN}$ in the respective capacitor ladder circuits.

Next, the A-D conversion apparatus 10 holds the sampled input voltage $V_{IN}$. In the present embodiment, the main D-A converter 30 and the correction D-A converter 34 control the charge acquired in the capacitor ladder circuits in a manner to not release the charge to the outside. The A-D conversion apparatus 10 then, while holding the input voltage $V_{IN}$, detects the output data $D_{OUT}$ that indicates a digital value corresponding to the input voltage $V_{IN}$ through a successive approximation process (S13).

When the detection of the output data $D_{OUT}$ is finished, the A-D conversion apparatus 10 outputs the detected output data $D_{OUT}$ to the outside. Here, the A-D conversion apparatus 10 may output the output data $D_{OUT}$ detected in a certain A-D conversion cycle in a cycle that follows the aforementioned A-D conversion cycle.

The A-D conversion apparatus 10 repeats the processes of step S12 to step S14 described above until a command to finish the A-D conversion process is supplied. Therefore, the A-D conversion apparatus 10 can convert the analog voltage signal into the digital data string.

Figure 3:
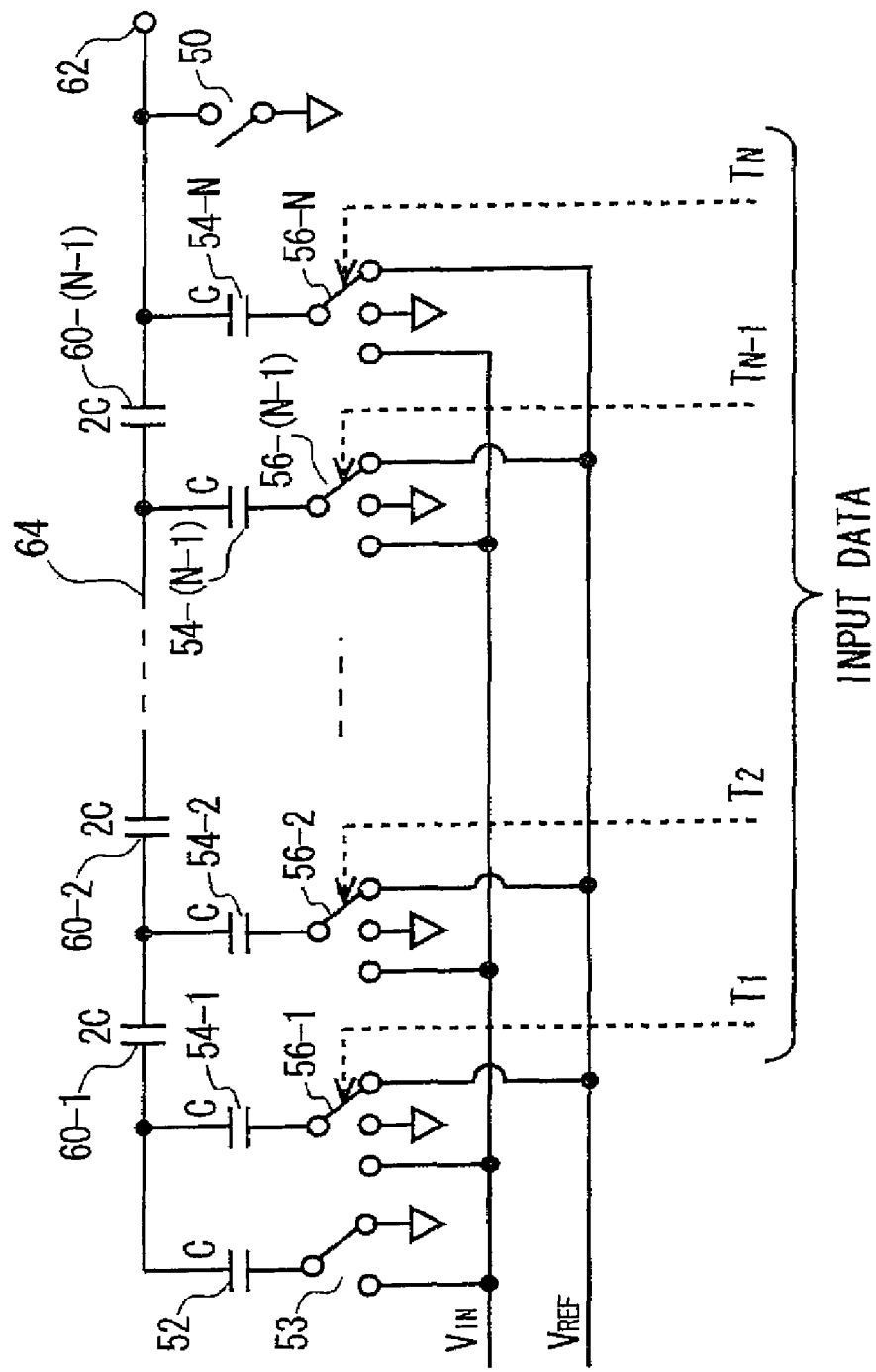
FIG. 3 shows a first example of a configuration of a charge redistribution main D-A converter 30.
Figure 4:
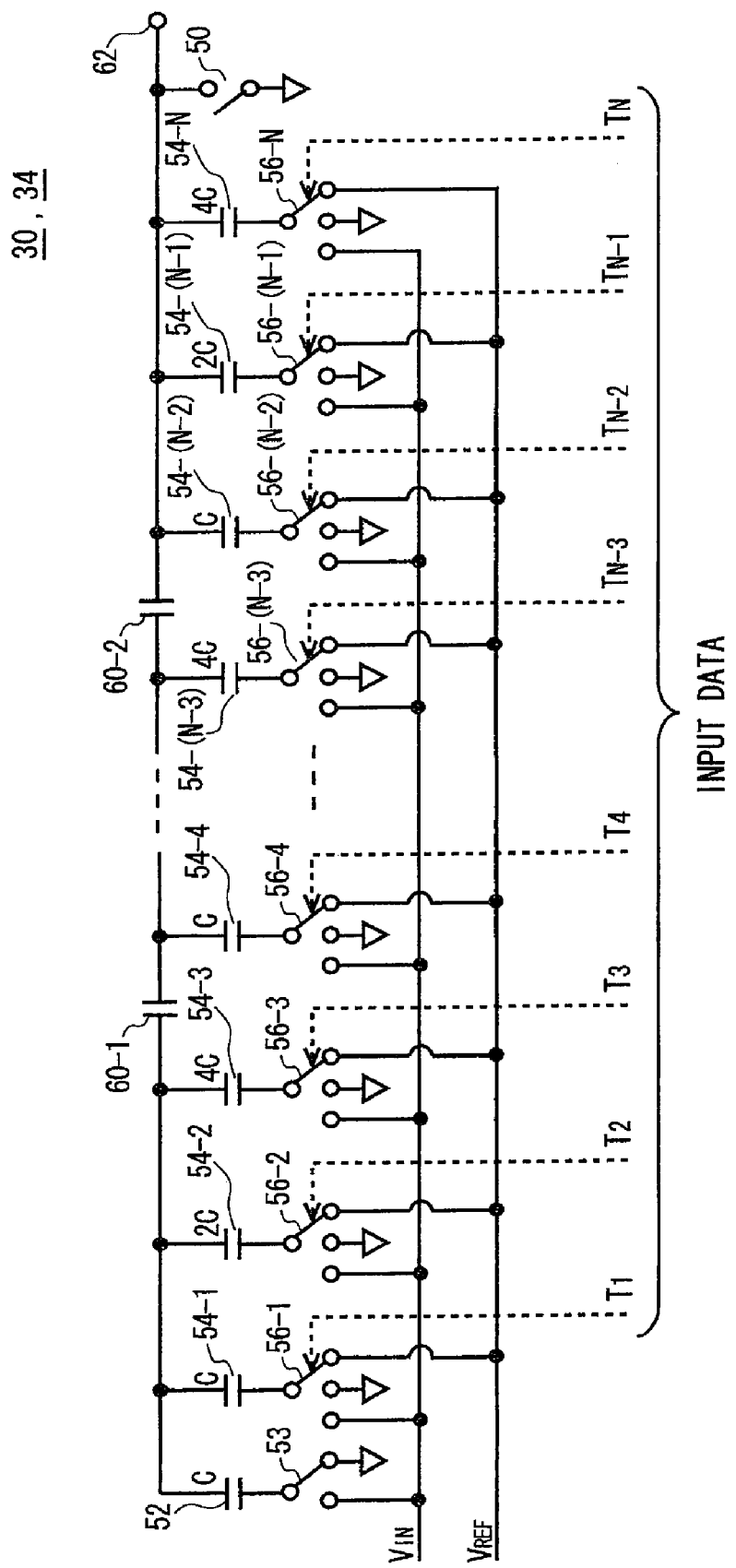
FIG. 4 shows a second example of a configuration of the charge redistribution main D-A converter 30.

FIG. 3 shows a first example of a configuration of the charge redistribution main D-A converter 30. FIG. 4 shows a second example of a configuration of the charge redistribution main D-A converter 30. Here, the main D-A converter 30 and the correction D-A converter 34 are different in that the number of bits of the input data (the comparison data $D_R$ or the correction data) for each is different but have substantially the same configuration and function in all other respects, and therefore the correction D-A converter 34 is not described with reference to FIG. 3 and FIG. 4.

The main D-A converter 30 is provided with a sampling switch 50, a dummy capacitor 52, a dummy switch 53, a plurality of parallel capacitors 54, and a plurality of first switches 56. The sampling switch 50 is disposed between the output end 62 of the main D-A converter 30 and the common potential. During sampling, the sampling switch 50 provides a short circuit between the output end 62 and the common potential. During holding, the sampling switch 50 opens between the output end 62 and the common potential.

A first of two ends of the dummy capacitor 52 is connected to the common potential or the input voltage $V_{IN}$ via the dummy switch 53. A second of two ends of the dummy capacitor 52, which is not connected to the common potential or the input voltage $V_{IN}$ (referred to hereinafter as "the second end of the dummy capacitor 52"), is connected to the output end 62 of the main D-A converter 30 via an output wire 64. During sampling, the dummy switch 53 connects the first end of the dummy capacitor 52, the end which is not connected to the output wire 64, to the input voltage $V_{IN}$. During holding, the dummy switch 53 connects the first end of the dummy capacitor 52, the end which is not connected to the output wire 64, to the common potential.

The plurality of parallel capacitors 54 is disposed to correspond to a plurality of bits of the input data. For example, the main D-A converter 30 may be provided with a first parallel capacitor 54-1 that corresponds to a first lower bit (least significant bit) of the input data, a second parallel capacitor 54-2 that corresponds to a second lower bit of the input data, . . . , and an N-th (where N is the number of bits of the input data) parallel capacitor 54-N that corresponds to a most significant bit of the input data.

A first of two ends of each parallel capacitor 54 in the plurality of parallel capacitors 54 is connected to the output wire 64 that provides a connection between the second end of the dummy capacitor 52 and the output end 62. Furthermore, in the plurality of parallel capacitors 54, the parallel capacitors 54 that correspond to higher bits are connected to the output wire 64 closer to the output end 62 of the main D-A converter 30.

The plurality of first switches 56 is provided to correspond to the plurality of bits of the input data. For example, the main D-A converter 30 may be provided with a first first switch 56-1 that corresponds to the first lower bit of the input data, a second first switch 56-2 that corresponds to the second lower bit of the input data, . . . , and an N-th first switch 56-N that corresponds to a most significant bit of the input data.

During sampling, a second of two ends of each first switch 56 in the plurality of first switches 56, which is the end that is not connected to the output wire 64 of the corresponding parallel capacitor 54 (hereinafter referred to as "the second end of the parallel capacitor 54"), is connected to the input voltage $V_{IN}$. Furthermore, during holding, each first switch 56 in the plurality of first switches 56 connects the second end of the corresponding parallel capacitor 54 to the reference potential or the common potential according to a value of the corresponding bit of the input data. For example, in a case where the value of the corresponding bit of the input data is one, each first switch 56 in the plurality of first switches 56 may connect the second end of the corresponding parallel capacitor 54 to the reference potential $V_{REF}$. Furthermore, for example, in a case where the value of the corresponding bit of the input data is zero, each first switch 56 in the plurality of first switches 56 may connect the second end of the corresponding parallel capacitor 54 to the common potential.

In addition, the main D-A converter 30 may be further provided with one or more serial capacitors 60. The serial capacitor 60 is disposed by being inserted serially into the output wire 64. In other words, each serial capacitor 60 is disposed by being inserted into the output wire 64 between two adjacent parallel capacitors 54. The main D-A converter 30 provided with the serial capacitor 60 can reduce the overall synthetic capacitance as seen from a side of the output end 62.

As shown in FIG. 3, the main D-A converter 30 may be provided with the serial capacitors 60 between all sets of two adjacent parallel capacitors 54. Instead of such a structure, the main D-A converter 30 may be provided with the serial capacitors 60 between only certain sets of two adjacent parallel capacitors 54, as shown in FIG. 4.

In the main D-A converter 30 described above, the capacitance of each capacitor is set such that the capacitance of a given parallel capacitor 54 is identical to the synthetic capacitance of the parallel capacitors 54, the serial capacitors 60, and the dummy capacitor 52 that are connected to the output wire 64 at positions corresponding to bits lower than the aforementioned parallel capacitor 54. In other words, the capacitance of each capacitor is set such that the capacitance Ck of the k-th bit parallel capacitor 54 is identical to the synthetic capacitance of the circuit in which a lower side (dummy capacitor 52 side) is seen from a connection point at which the k-th bit parallel capacitor 54 is connected to the output wire 64. Therefore, the main D-A converter 30 can switch the potential to which the capacitance determined according to the weight of the corresponding bit between the reference potential $V_{REF}$ and the common potential, according to the value of each of the plurality of bits of the input data.

For example, as shown in FIG. 3, in a case where the serial capacitors 60 are disposed between all sets of two adjacent parallel capacitors 54, the capacitances of the dummy capacitor 52 and the parallel capacitor 54 are each set to the reference capacitance C. Furthermore, in such a case, the capacitance of each serial capacitor 60 is set to be double the reference capacitance C.

Furthermore, as shown in FIG. 4, in a case where groups of three parallel capacitors 54 are connected to the output wire 64 between two adjacent serial capacitors 60, the output wire 64 between the dummy capacitor 52 and one of the two serial capacitors 60, and the output wire 64 between the output end 62 and one of the two serial capacitors 60, the following setting is used. Specifically speaking, in such a case, the capacitance of the dummy capacitor 52 is set to the reference capacitance C. In each group of three parallel capacitors 54, the capacitance of a first parallel capacitor 54 corresponding to the lowest bit is set to the reference capacitance C, the capacitance of a second parallel capacitor 54 corresponding to the second lowest bit is set to double the reference capacitance C, and the capacitance of a third parallel capacitor 54 corresponding to the highest bit is set to four times the reference capacitance C. Furthermore, the capacitance of each serial capacitor 60 is adjusted such that the synthetic capacitance of the circuit towards a lower bit side that includes the serial capacitor 60 is identical to the capacitance of the parallel capacitor 54 that is immediately higher than the aforementioned serial capacitor 60.

During sampling, in the charge redistribution main D-A converter 30 described above, the sampling switch 50 is turned on to connect the output end 62 to the common potential, the plurality of parallel capacitors 54 select the input voltage $V_{IN}$, so that the input voltage $V_{IN}$ is applied to the second end of each parallel capacitor 54 in the plurality of parallel capacitors 54. Therefore, during sampling, the main D-A converter 30 can acquire the charge according to the input voltage $V_{IN}$ to sample the input voltage $V_{IN}$.

Furthermore, during holding, in the charge redistribution main D-A converter 30 described above, the sampling switch 50 is turned off to open the output end 62 and the application of the input voltage $V_{IN}$ to the second end of each parallel capacitor 54 in the plurality of parallel capacitors 54 is stopped. Therefore, during holding, the main D-A converter 30 can apply a voltage $(-V_{IN})$ that is opposite the input voltage $V_{IN}$ to the output end 62 and hold the aforementioned voltage because the charge according to the input voltage $V_{IN}$ is not released to the outside.

In addition to the above, during holding, the second end of each parallel capacitor 54 in the plurality of parallel capacitors 54 is connected to the reference potential $V_{REF}$ in a case where the corresponding bit value of the input data is one and connected to the common potential in a case where the corresponding bit value of the input data is zero. Therefore, the output end 62 is connected to the reference potential $V_{REF}$ via a capacitance proportionate to a value obtained by totaling the weights of bits that have a value of one and is connected to the common potential via a capacitance proportionate to a value obtained by totaling the weights of bits that have a value of zero.

Accordingly, during holding, the dummy capacitor 52 and the plurality of parallel capacitors 54 can apply the comparison voltage $V_R$, which is represented by Equation (1) below, to the output end 62 of the main D-A converter 30. Here, in Equation (1), $T_1$ represents a value of the first bit from the bottom (least significant bit) of the input data, $T_2$ represents a value of the second bit from the bottom of the input data, ..., and $T_N$ represents a value of the N-th bit from the bottom (most significant bit) of the input data.

$$V_R = \{(V_{REF}/2^1)X(T_N) + (V_{REF}/2^2)X(T_{N-1}) + \ldots + (V_{REF}/2^{N-1})X(T_2) + (V_{REF}/2^N)X(T_1)\} \quad \text{Equation (1):}$$

From the above, during holding, the voltage $(-V_{IN})$ that is opposite the input voltage $V_{IN}$ and the comparison voltage $V_R$ expressed by the above Equation (1) are applied to the output end 62. Accordingly, during holding, the charge redistribution main D-A converter 30 can output from the output end 62 a voltage $(V_R - V_{IN})$ obtained by adding the voltage $(-V_{IN})$ that is opposite the input voltage $V_{IN}$ to the comparison voltage $V_R$.

Figure 5:
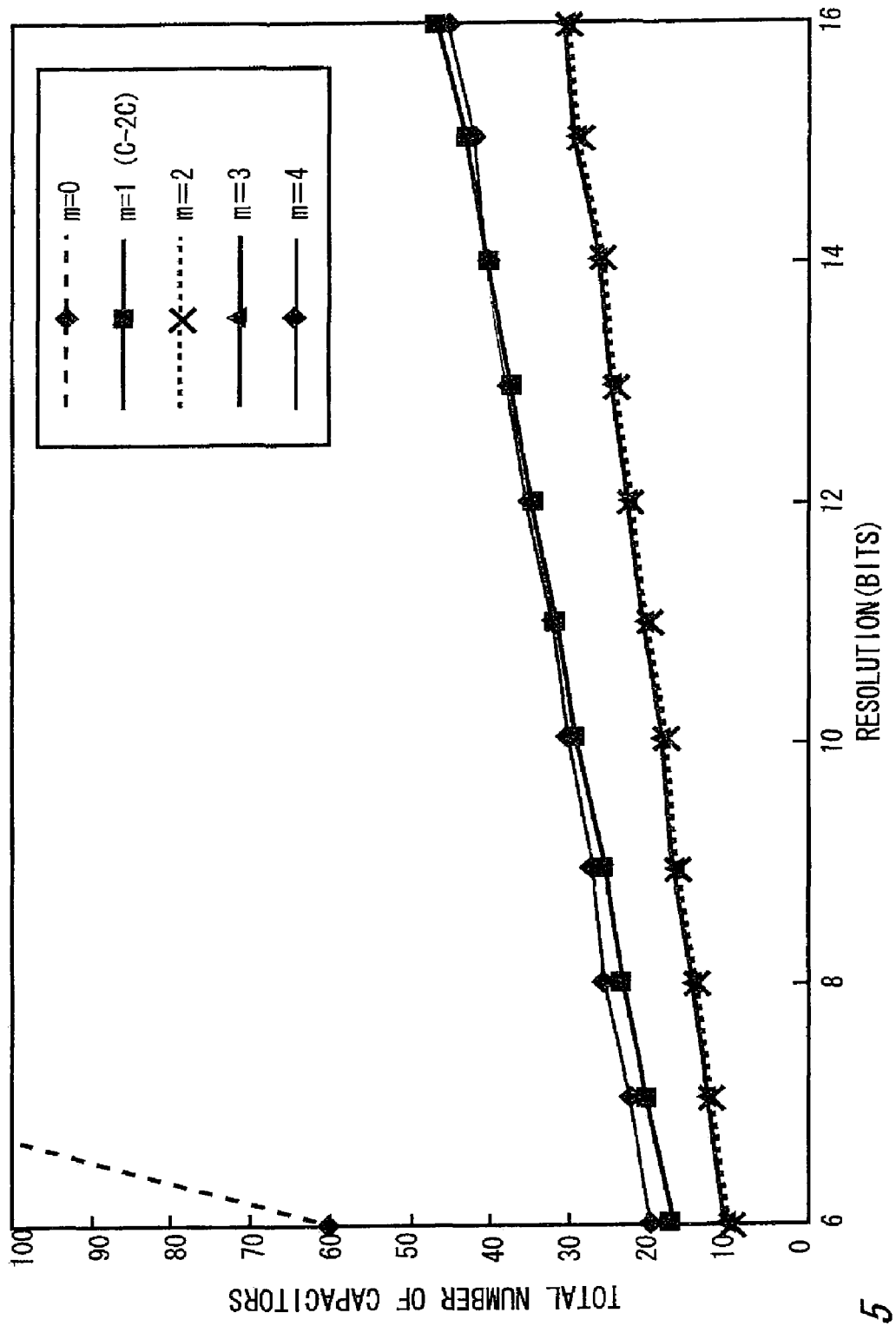
FIG. 5 shows a relationship between the resolution and the total number of capacitors of the charge redistribution main D-A converter 30.

FIG. 5 shows a relationship between the resolution and the total number of capacitors of the charge redistribution main D-A converter 30. In FIG. 5, m represents the number of bits associated with one group of parallel capacitors 54 connected between two adjacent serial capacitors 60.

Here, as shown in FIG. 5, the total number of capacitors of the charge redistribution main D-A converter 30 is smaller in a case where m=2 and m=3 than in a case where m=0 (in other words, a case where serial capacitors 60 are not included), m=1, and m=4. Accordingly, the main D-A converter 30 may have a configuration in which two or three parallel capacitors 54 are connected to the output wire 64 between two adjacent serial capacitors 60, the output wire 64 between the dummy capacitor 52 and one of the serial capacitors 60, and output wire 64 between one of the serial capacitors 60 and the output end 62 of the main D-A converter 30. Therefore, the charge redistribution main D-A converter 30 can have a simple configuration with a small total number of capacitors.

Furthermore, as shown in FIG. 5, the total number of capacitors in a case where m=2 and the total number of capacitors in a case where m=3 are substantially the same in any resolution. Here, the charge redistribution main D-A converter 30 has better linearity when m is greater.

In a case where the capacitor ladder circuit is manufactured on a semiconductor chip, each capacitor has a MIM (Metal Insulator Metal) structure. In a MIM capacitor, however, there is a difference between the parasitic capacitance of an upper electrode and the parasitic capacitance of a lower electrode. Accordingly, a serial capacitor 60 having the capacitances of both the upper electrode and the lower electrode used becomes a source of linearity error generation in a charge redistribution D-A converter. In other words, the charge redistribution main D-A converter has better linearity in a case where a lower number of serial capacitors 60 are provided, the case where m=3, than in the case where m=2.

Accordingly, the main D-A converter 30 may have a configuration in which groups of three parallel capacitors 54 are connected to the output wire 64 between two adjacent serial capacitors 60, the output wire 64 between the dummy capacitor 52 and one of the serial capacitors 60, and output wire 64 between one of the serial capacitors 60 and the output end 62 of the main D-A converter 30. In such a case, each group of three parallel capacitors 54 may include a first parallel capacitor 54 having a reference capacitance C and corresponding to the least significant bit, a second parallel capacitor 54 having double the reference capacitance and corresponding to a second bit from the bottom, and a third parallel capacitor 54 having four times the reference capacitance and corresponding to the most significant bit. The charge redistribution main D-A converter 30 described above can provide good linearity and has a decreased number of capacitors.

Figure 6:
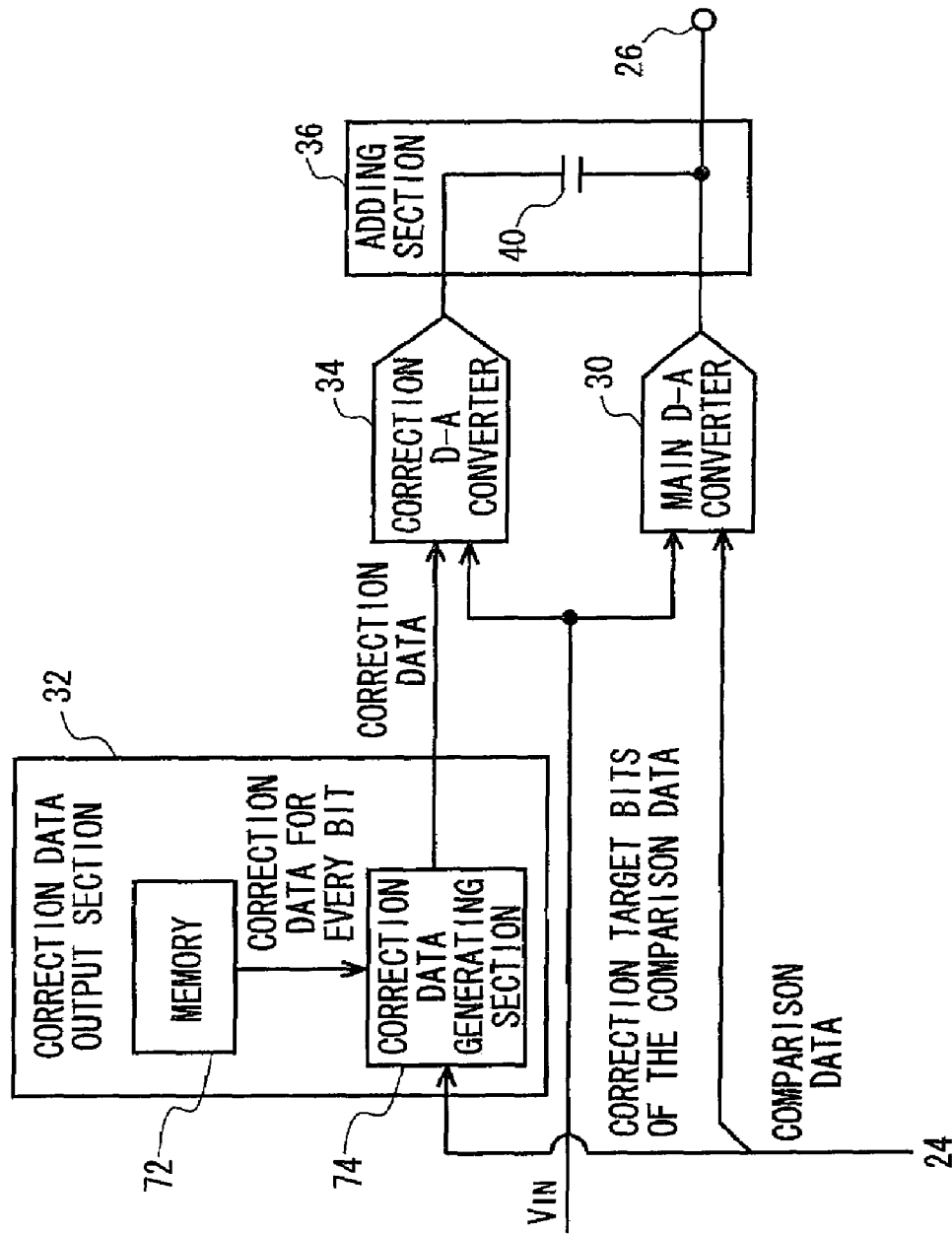
FIG. 6 shows an exemplary configuration of a correction data output section 32 along with the main D-A converter 30, a correction D-A converter 34, and an adding section 36.

FIG. 6 shows an exemplary configuration of the correction data output section 32 along with the main D-A converter 30, the correction D-A converter 34, and the adding section 36. The capacitance array main D-A converter 30 allocates a capacitance to each bit in the plurality of bits of the comparison data $D_R$ according to the weight of the corresponding bit. The linearity error of the main D-A converter 30 is determined by the error of the capacitance allocated to each bit.

Therefore, as one example, the D-A conversion apparatus 20 may set correction data of every bit in the plurality of bits of the comparison data $D_R$. The correction data of every bit may be the same as the correction data for the input data in which the value of the target bit is one and the values of the other bits are zero, for example.

The correction data output section 32 may then output as the correction data a cumulative addition result obtained by cumulatively adding the correction data of every bit that corresponds to a bit having a value of one in the comparison data $D_R$. Therefore, the correction data output section 32 can accurately correct the linearity of the main D-A converter 30.

Furthermore, there are cases where the linearity error of the main D-A converter 30 depends heavily on the errors of some of the bits of the comparison data $D_R$. Therefore, as one example, the D-A conversion apparatus 20 may determine one or more correction target bits in the bits of the comparison data $D_R$, for which correction data associated with a single bit is defined.

The D-A conversion apparatus 20 may, for example, determine as the correction target bits the upper bits of the comparison data $D_R$. The correction data output section 32 may then cumulatively add the correction data corresponding to each correction target bit that has a value of one from among the one or more correction target bits of the comparison data $D_R$ and output the cumulative addition result as the correction data.

The correction data output section 32 may include, for example, a memory 72 and a correction data generating section 74. The memory 72 stores therein the correction data associated with each of the correction target bits.

The correction data generating section 74 receives the comparison data $D_R$ from the control section 24. The correction data generating section 74 selects correction target bits having a value of one from among the one or more correction target bits of the comparison data $D_R$. The correction data generating section 74 reads from the memory 72 the correction data corresponding to each of the selected correction target bits and cumulatively adds the read pieces of correction data. The correction data generating section 74 then outputs the cumulative addition result as the correction data. In the manner described above, the correction data output section 32 can output correction data obtained by cumulatively adding the correction data.

FIG. 7 shows an example of the correction data stored in the memory 72. FIG. 8 shows an example of the cumulative addition process by the correction data generating section 74.

As shown in FIG. 7, the memory 72 stores therein the correction data in association with each of the one or more correction target bits of the comparison data $D_R$. Alternatively, the memory 72 may store thereon the correction data in association with each of all the bits of the comparison data $D_R$. In such a case, the memory 72 stores correction data of every bit having a value of zero for every bit that is not a correction target bit.

As shown in FIG. 8, the correction data generating section 74 reads from the memory 72 the correction data of every bit corresponding to the correction target bits having a value of one from among the correction target bits of the comparison data $D_R$. The correction data generating section 74 then cumulatively adds the read correction data of every bit and outputs the cumulative addition result as the correction data. Here, in a case where the memory 72 stores correction data of every bit having a value of zero for every bit that is not a correction target bit, the correction data generating section 74 may read from the memory 72 the correction data of every bit corresponding to the bits having a value of one from among all bits of the comparison data $D_R$ and cumulatively add the read correction data.

FIG. 9 shows an example of correction data stored in the memory 72. Instead of the correction data of every bit, the memory 72 may store correction data obtained by cumulatively adding in advance the pieces of correction data each corresponding to a single bit for each combination of the values of all the correction target bits, as shown in FIG. 9.

In such a case, the correction data generating section 74 reads from the memory 72 one piece of correction data corresponding to a combination of values of a plurality of correction target bits of the input comparison data $D_R$. The correction data generating section 74 then outputs the read correction data without modification. Therefore, the correction data output section 32 can quickly output the correction data obtained by cumulatively adding the correction data of every bit.

Figure 10:
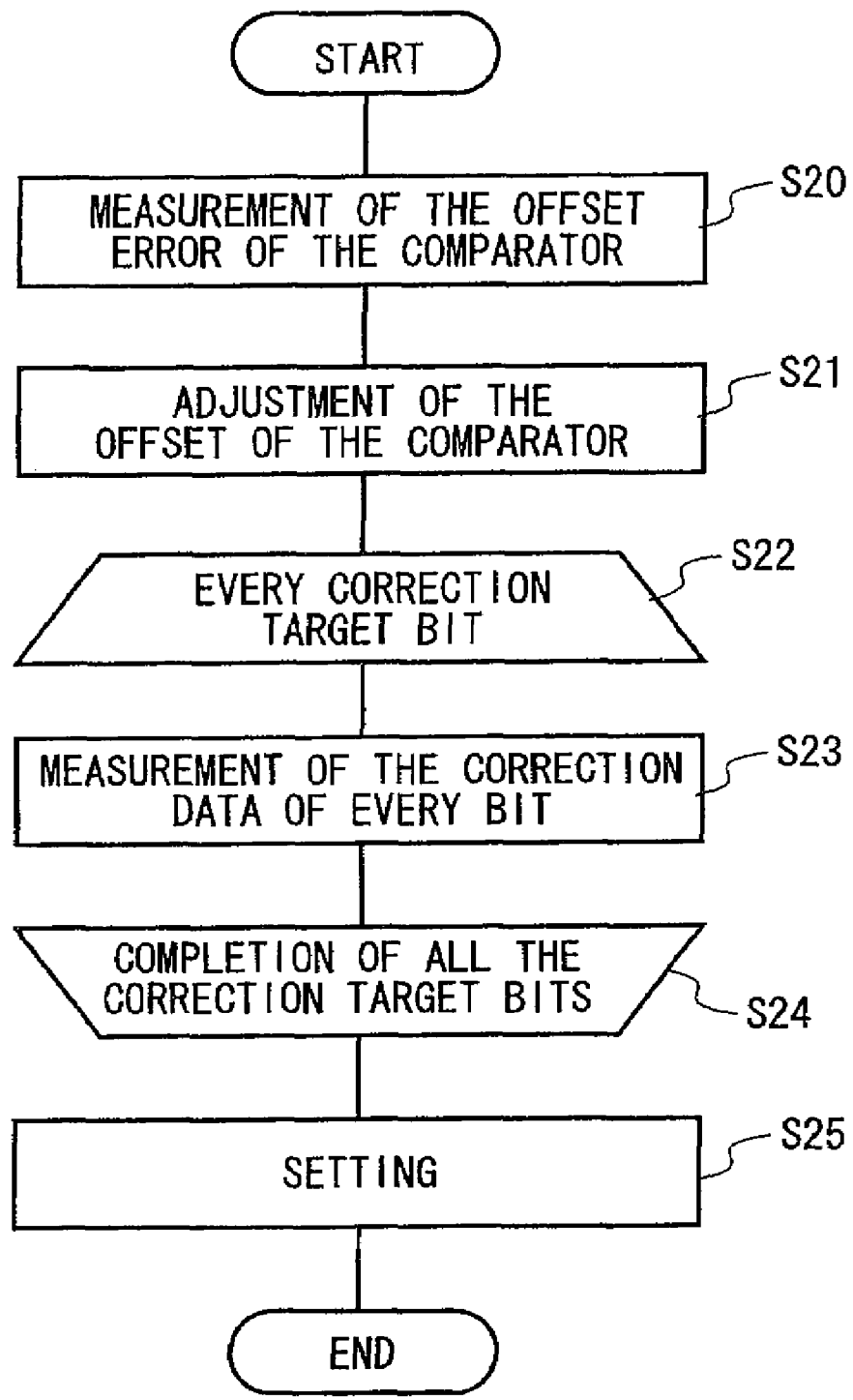
FIG. 10 shows a flow of a process of a calibration section 38.

FIG. 10 shows a flow of the process of the calibration section 38. Prior to the A-D conversion process, the calibration section 38 performs the calibration process of step S20 to step S25. The calibration section 38 may perform the calibration process in a case where, for example, the power of the D-A conversion apparatus 20 is turned on and a prescribed instruction is received from the outside. Furthermore, the calibration section 38 may perform the calibration process at constant intervals after the power is turned on.

First, the calibration section 38 measures the offset error of the comparator 22 connected to the D-A conversion apparatus 20 as the following stage (S20). Next, the calibration section 38 adjusts the offset of the comparator 22 based on the offset error of the comparator 22 measured at step S20 (S21). For example, the calibration section 38 adjusts the offset of the comparator 22 in a manner to set the offset error of the comparator 22 to zero.

Next, the calibration section 38 measures the correction data (S23) associated with each correction target bit of the comparison data $D_R$ (S22, S24). Then, when measuring of the correction data of every bit is finished for all of the correction target bits (S24), the calibration section 38 sets in the correction data output section 32 the measured correction data of every bit (S25). For example, the calibration section 38 may write the correction data of every bit onto the memory 72 in the correction data output section 32.

Furthermore, as a modification of the process described above, at step S21, the calibration section 38 may hold the offset error in the memory without adjusting the offset of the comparator 22. In such a case, at a step prior to step S25, the calibration section 38 generates the correction data by removing the offset error from the correction data of every bit and cumulatively adding the correction data of every bit from which the offset error is removed for every combination of values of all the correction target bits. Then, at step S25, the calibration section 38 sets in the correction data output section 32 the correction data of every combination of values of the correction target bits.

Figure 11:
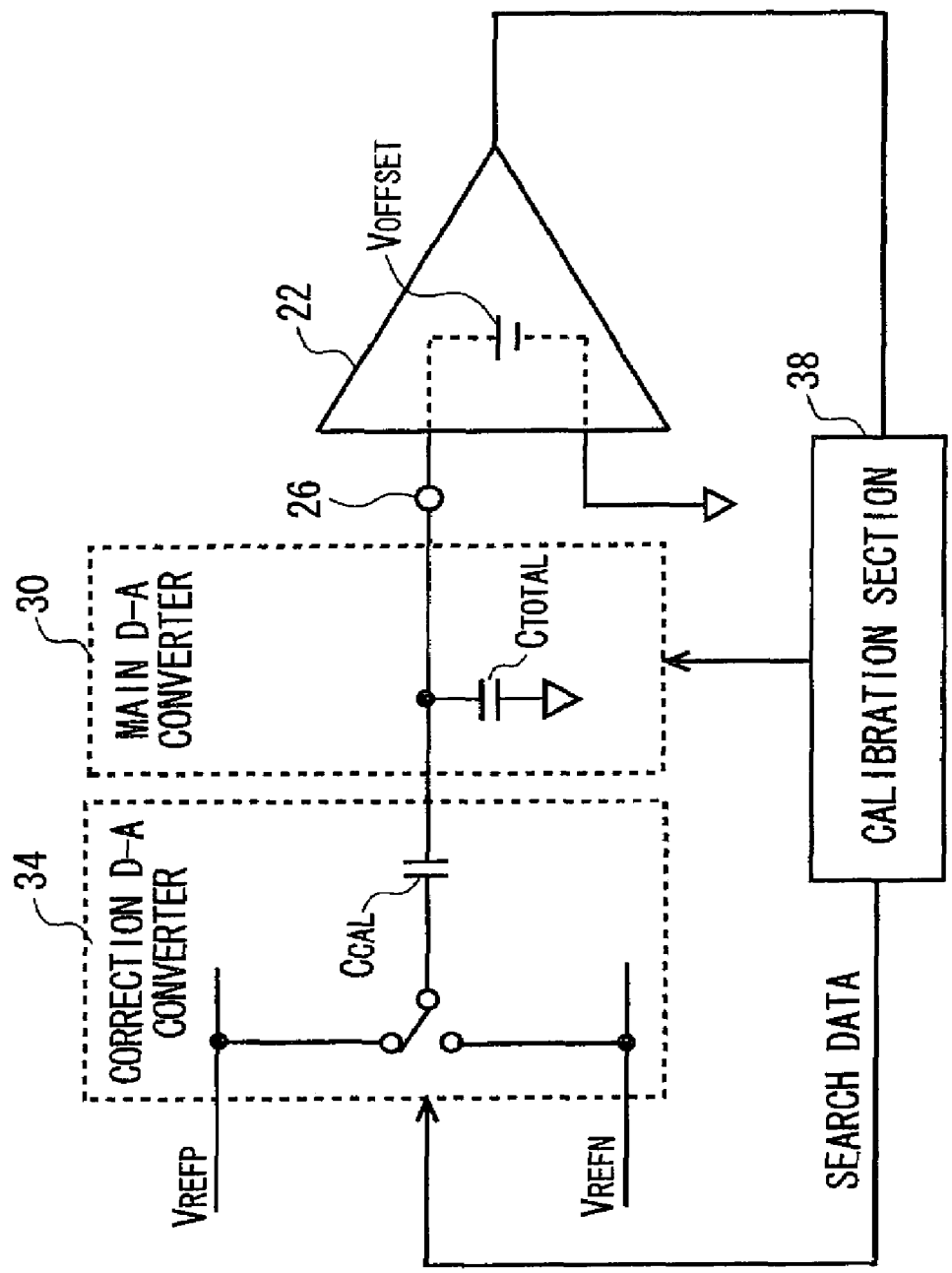
FIG. 11 shows an exemplary control of a case where an offset error of the comparator 22 is measured at step S20 of FIG. 10.

FIG. 11 shows an exemplary control performed when the offset error of the comparator 22 is measured at step S20 of FIG. 10. In a case where the offset error of the comparator 22 is measured, the calibration section 38 sets the main D-A converter 30 such that the second end of each parallel capacitor 54 in the plurality of parallel capacitors 54 is connected to the common potential. The result of the aforementioned setting is that the main D-A converter 30 can apply the common potential to the output terminal 26.

Ideally, the comparator 22 outputs a result obtained by comparing the output voltage of the output terminal 26 to the common potential. In a case where an offset voltage $V_{OFFSET}$ is included, however, the comparator 22 outputs a result obtained by comparing the output voltage of the output terminal 26 to the offset voltage.

With the main D-A converter 30 set in the condition described above, the calibration section 38 supplies the search data instead of the correction data to the correction D-A converter 34. The calibration section 38 then changes the search data in order to detect the search data through which the output voltage of the output terminal 26 is identical to the offset voltage through the successive approximation process.

The search data detected in the manner described above is a result obtained by A-D converting the offset voltage of the comparator 22 using the correction D-A converter 34. Accordingly, the calibration section 38 adjusts the offset of the comparator 22 according to the search data detected in the manner described above. In the manner described above, the calibration section 38 can measure the offset of the comparator 22.

In such a case, the calibration section 38 may switch the reference potential supplied to the correction D-A converter 34 between a positive reference potential $V_{REF}P$ and a negative reference potential $V_{REF}N$ symmetrically sandwiching the common potential with the positive reference potential $V_{REF}P$. Therefore, the calibration section 38 can measure the positive offset voltage and the negative offset voltage in relation to the common potential.

Figure 12:
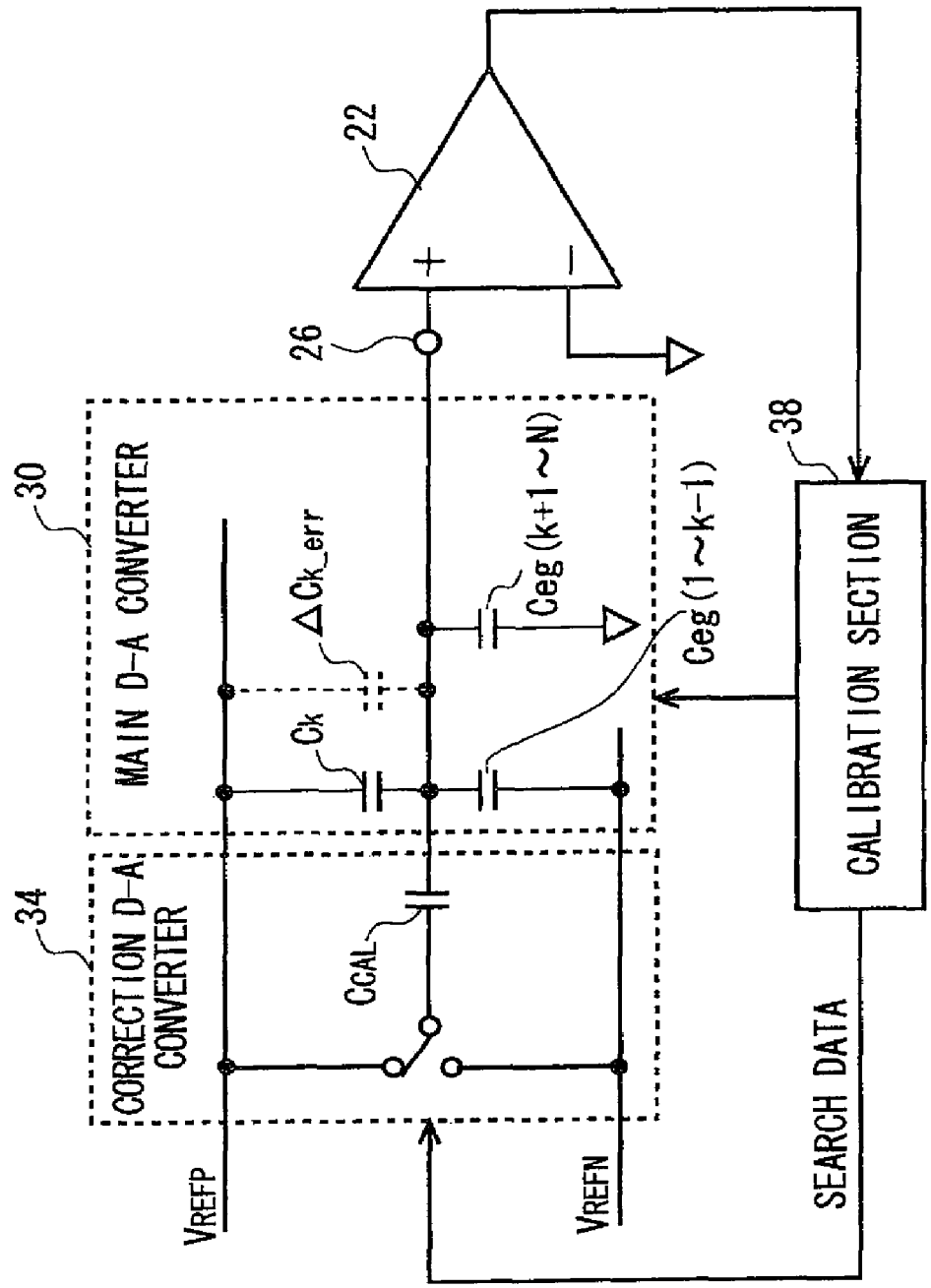
FIG. 12 shows a control example in a case where correction data of every bit corresponding to one correction target bit (a k-th bit from the bottom) is measured at step S23 of FIG. 10.

FIG. 12 shows a control example in a case where the correction data corresponding to one correction target bit (a k-th bit from the bottom) is measured at step S23 of FIG. 10. In a case where the correction data corresponding to one correction target bit (the k-th bit from the bottom) is measured, the calibration section 38 sets the main D-A converter 30 in the following manner.

The calibration section 38 connects the second end of the parallel capacitor 54 corresponding to bits that are positioned lower than the one correction target bit (a first to (k−1)-th bit from the bottom) to the negative reference potential $V_{REF}N$. The calibration section 38 connects the second end of the parallel capacitor 54 corresponding to the one correction target bit (the k-th bit from the bottom) to the positive reference potential $V_{REF}P$. The calibration section 38 connects the second end of the parallel capacitor 54 corresponding to bits that are positioned higher than the one correction target bit (a (k+1)-th to N-th bit from the bottom) to the common potential.

The capacitance (Ck) allocated to the one correction target bit (the k-th bit from the bottom) and the synthetic capacitance (Ceq (1~k−1)) of the capacitances allocated to the bits lower then the one correction target bit (the k-th bit from the bottom) are ideally the same. Accordingly, as a result of the setting described above, the main D-A converter 30, ideally, applies the common potential to the output terminal 26.

However, the capacitance (Ck) allocated to the one correction target bit (the k-th bit from the bottom) includes an error capacitance (ΔCk_err). Accordingly, as a result of the setting described above, the main D-A converter 30 actually supplies to the output terminal 26 a voltage that is different from the common potential by an amount of potential according to the error capacitance (ΔCk_err).

While the main D-A converter 30 is set in the manner described above, the calibration section 38 supplies search data instead of correction data to the correction D-A converter 34. The calibration section 38 then changes the search data in order to detect the search data through which the output voltage of the output terminal 26 is identical to the common potential through the successive approximation process.

The search data detected in the manner described above is a result obtained by A-D converting the voltage according to the error capacitance (ΔCk_err) of the one correction target bit. Accordingly, the calibration section 38 determines the correction data of every bit corresponding to the one correction target bit based on the search data detected in the manner described above. For example, the calibration section 38 may detect as the correction data of every bit corresponding to the one correction target bit the data that causes the correction D-A converter 34 to output a correction voltage that cancels out the voltage according to the error capacitance (ΔCk_err) of the one correction target bit.

In such a case, the calibration section 38 may switch the reference potential supplied to the correction D-A converter 34 between the positive reference potential $V_{REF}P$ and the negative reference potential $V_{REF}N$. Therefore, the calibration section 38 can measure the output voltage of the output terminal 26 both in a case where the capacitance Ck allocated to the k-th bit is greater than the ideal value and in a case where the capacitance Ck allocated to the k-th bit is less than the ideal value.

Figure 13:
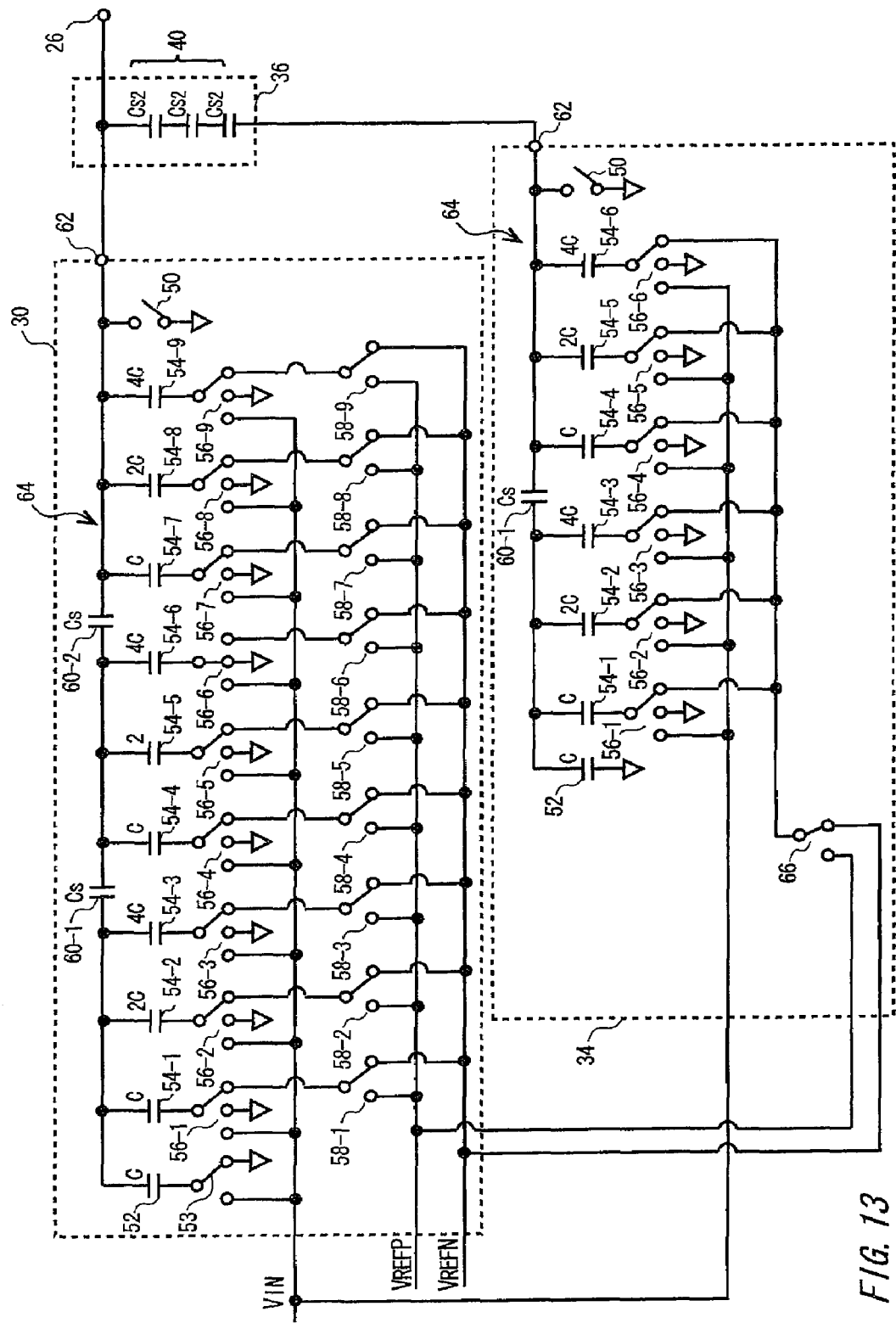
FIG. 13 shows an exemplary configuration of the correction D-A converter 34 and the main D-A converter 30 through which the control shown in FIG. 12 can be achieved, along with the adding section 36.

FIG. 13 shows an exemplary configuration of the correction D-A converter 34 and the main D-A converter 30 through which the control shown in FIG. 12 can be achieved, along with the adding section 36. The main D-A converter 30 and the correction D-A converter 34 shown in FIG. 12 adopt substantially the same structure as the main D-A converter 30 shown in FIG. 4, and therefore the following description omits all but different points.

In the present embodiment, the main D-A converter 30 is further provided with a plurality of second switches 58. The plurality of second switches 58 is disposed to correspond to the plurality of bits of the input data. For example, the main D-A converter 30 may be provided with a first second switch 58-1 that corresponds to a first bit from the bottom, a second second switch 58-2 that corresponds to a second bit from the bottom, . . . , and an N-th second switch 58-N that corresponds to a most significant bit. During holding, each second switch 58 in the plurality of second switches 58 switches the reference potential connected to the second end of the corresponding parallel capacitor 54 between the positive reference potential $V_{REF}P$ and the negative reference potential $V_{REF}N$ according to the value of the bit that expresses the positive/negative sign of the input data.

Furthermore, switching of the sampling switch 50, each first switch 56 from the plurality of first switches 56, and each second switch 58 from the plurality of second switches 58 during calibration is controlled by the calibration section 38. Specifically, the calibration section 38 switches the sampling switch 50 to cut the connection between the output end 62 and the common potential.

Furthermore, the calibration section 38 provides the negative reference potential $V_{REF}N$ to the second end of the parallel capacitor 54 corresponding to the bits lower than the calibration target bits (a first to (k−1)-th bit from the bottom) by switching the corresponding first switches 56 and second switches 58. The calibration section 38 provides the positive reference potential $V_{REF}P$ to the second end of the parallel capacitor 54 corresponding to the calibration target bits (the k-th bit from the bottom) by switching the corresponding first switches 56 and second switches 58. The calibration section 38 provides the common potential to the second end of the parallel capacitor 54 corresponding to the bit higher than the calibration target bits (a (k+1)-th to N-th bit from the bottom) by switcing the corresponding first switches 56 and second switches 58.

In the present embodiment, the correction D-A converter 34 is further provided with a third switch 66. During holding, each first switch 56 in the plurality of first switches 56 switches the reference potential connected to the second end of the corresponding parallel capacitor 54 between the negative reference potential $V_{REF}N$ and the positive reference potential $V_{REF}P$ according to the value of the bit that expresses the positive/negative sign of the input data. Therefore, the correction D-A converter 34 can output the correction voltage that is positive in relation to the common potential and the correction voltage that is negative in relation to the common potential. Here, in a case where a portion of the plurality of bits is set as the correction target bits, the main D-A converter 30 may be provided with the plurality of second switches 58 corresponding to at least the correction target bits, and second switches 58 need not be provided for bits other than the correction target bits.

Figure 14:
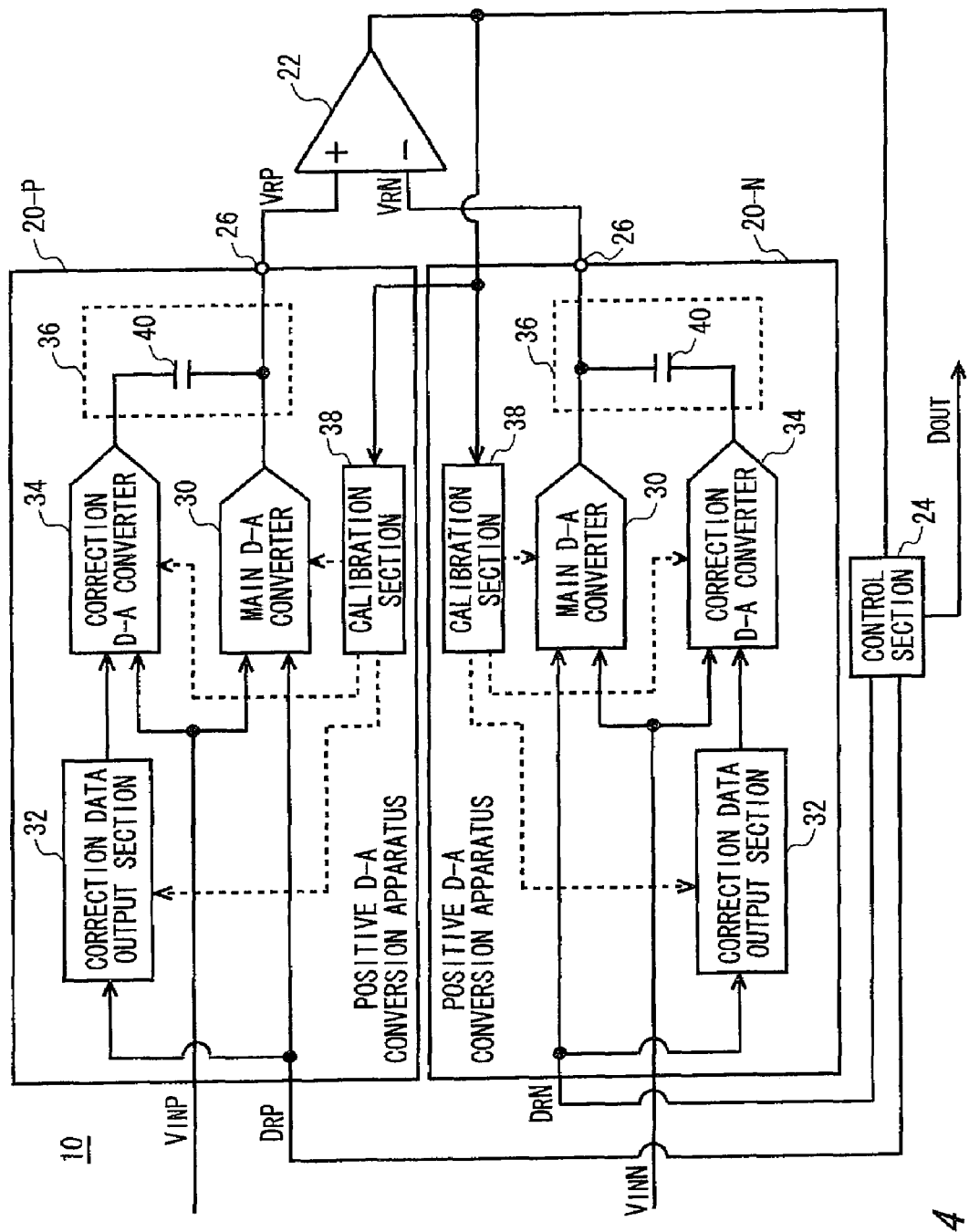
FIG. 14 shows a configuration of the differential A-D conversion apparatus 10 according to a modification of the present embodiment.

FIG. 14 shows a configuration of the differential A-D conversion apparatus 10 according to a modification of the present embodiment. The A-D conversion apparatus 10 according to the present modification adopts substantially the same structure and function as the A-D conversion apparatus 10 shown in FIG. 1, and therefore components that have substantially the same structure and function as components shown in FIG. 1 are given the same numerals and the following description omits all but different points.

The A-D conversion apparatus 10 according to the present modification outputs the digital data $D_{OUT}$ according to differential analog input voltages ($V_{IN}P$, $V_{IN}N$). The A-D conversion apparatus 10 according to the present modification is provided with a positive D-A conversion apparatus 20-P, a negative D-A conversion apparatus 20-N, the comparator 22 and the control section 24.

The positive D-A conversion apparatus 20-P receives positive comparison data $D_RP$ and outputs a positive comparison voltage $V_RP$ according to the positive comparison data $D_RP$. Furthermore, the positive D-A conversion apparatus 20-P samples the positive input voltage $V_{IN}P$ during sampling and holds the sampled positive input voltage $V_{IN}P$ during holding. During holding, because the positive comparison data $D_RP$ is supplied, the positive D-A conversion apparatus 20-P outputs a voltage obtained by subtracting the positive comparison voltage $V_RP$ from the positive input voltage $V_{IN}P$.

The negative D-A conversion apparatus 20-N receives negative comparison data $D_RN$ and outputs a negative comparison voltage $V_RN$ according to the negative comparison data $D_RN$. Furthermore, the negative D-A conversion apparatus 20-N samples the negative input voltage $V_{IN}N$ during sampling and holds the sampled negative input voltage $V_{IN}N$ during holding. During holding, because the negative comparison data $D_RN$ is supplied, the negative D-A conversion apparatus 20-N outputs a voltage obtained by subtracting the negative comparison voltage $V_RN$ from the negative input voltage $V_{IN}N$.

The positive D-A conversion apparatus 20-P and the negative D-A conversion apparatus 20-N may each have a configuration identical to that of the D-A conversion apparatus 20 shown in FIG. 1. In other words, the positive D-A conversion apparatus 20-P and the negative D-A conversion apparatus 20-N may each include the main D-A converter 30, the correction data output section 32, the correction D-A converter 34, the adding section 36, and the calibration section 38.

The comparator 22 outputs a comparison result obtained by comparing the voltage difference between the positive input voltage $V_{IN}P$ and the negative input voltage $V_{IN}N$ to the voltage difference between the positive comparison voltage $V_RP$ and the negative comparison voltage $V_RN$. In the present example, the comparator 22 outputs the result obtained by comparing the output voltage output from the output terminal 26 of the positive D-A conversion apparatus 20-P to the output voltage output from the output terminal 26 of the negative D-A conversion apparatus 20-N.

The control section 24 supplies positive comparison data $D_RP$ to the positive D-A conversion apparatus 20-P. Furthermore, the control section 24 supplies negative comparison data $D_RN$, which is obtained by inverting the positive comparison data $D_RP$ in terms of the positive/negative sign, to the negative D-A conversion apparatus 20-N. Then, through the successive approximation process, the control section 24 detects the positive comparison data $D_RP$ and the negative comparison data $D_RN$ through which the voltage difference between the positive input voltage $V_{IN}P$ and the negative input voltage $V_{IN}N$ is identical to the voltage difference between the positive comparison voltage $V_RP$ and the negative comparison voltage $V_RN$.

The control section 24 then outputs the detected positive comparison data $D_RP$ or the detected negative comparison data $D_RN$ as the output data $D_{OUT}$. In the manner described above, the A-D conversion apparatus 10 according to the present modification can convert the voltage difference between the positive input voltage $V_{IN}P$ and the negative input voltage $V_{IN}N$ into the output data $D_{OUT}$.

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

What is claimed is:

1. A D-A conversion apparatus that outputs an analog output voltage according to digital input data, comprising:
    a capacitance array main D-A converter that supplies a main voltage according to the input data to an output terminal of the D-A conversion apparatus;
    a correction data output section that outputs correction data according to the input data;
    a capacitance array correction D-A converter that outputs a correction voltage according to the correction data; and
    a voltage dividing capacitor connected serially between an output end of the correction D-A converter and an output end of the main D-A converter,
    wherein
        the main D-A converter includes:
            a dummy capacitor having a first end thereof connected to a common potential;
            a plurality of parallel capacitors that is disposed to correspond to a plurality of bits of the input data, each parallel capacitor having a first end thereof connected to an output wire providing a connection between a second end of the dummy capacitor, which is not connected to the common potential, and the output end of the main D-A converter;
            a plurality of first switches that is disposed to correspond to the plurality of bits of the input data, each first switch connecting a second end of a corresponding parallel capacitor to one of a reference potential and the common potential according to a value of a corresponding bit; and
            one or more serial capacitors disposed on the output wire so as to be connected in series to each other,
        the plurality of parallel capacitors are arranged such that the parallel capacitors corresponding to higher bits are connected to the output wire closer to the output end of the main D-A converter,
        a particular parallel capacitor has a capacitance identical to a synthetic capacitance of one or more serial capacitors, the dummy capacitor, and one or more parallel capacitors that are connected to the output wire at positions of bits lower than the particular parallel capacitor, and
        two or three parallel capacitors are connected to the output wire between two adjacent serial capacitors, between the dummy capacitor and one of the serial capacitors, and between one of the serial capacitors and the output end of the main D-A converter.

2. The D-A conversion apparatus according to claim 1, wherein a set of a first parallel capacitor having a reference capacitance, a second parallel capacitor having a capacitance double the reference capacitance, and a third parallel capacitor having a capacitance four times the reference capacitance is connected to the output wire between the two adjacent serial capacitors, between the dummy capacitor and one of the serial capacitors, and between one of the serial capacitors and the output end of the main D-A converter.

3. The D-A conversion apparatus according to claim 1, wherein the correction D-A converter and the voltage dividing capacitor have a synthetic capacitance equal to the synthetic capacitance of the correction D-A converter multiplied by two raised to a power.

4. The D-A conversion apparatus according to claim 1, further comprising a calibration section that determines the correction data during calibration based on a result obtained by A-D converting the main voltage output by the main D-A converter by means of the correction D-A converter.

5. A D-A conversion apparatus that outputs an analog output voltage according to digital input data, comprising:
    a main D-A converter that supplies a main voltage according to the input data to an output terminal of the D-A conversion apparatus;
    a correction data output section that outputs correction data according to the input data;
    a correction D-A converter that outputs a correction voltage according to the correction data;
    an adding section that adds the correction voltage to the main voltage; and
    a calibration section that determines the correction data during calibration based on a result obtained by using the correction D-A converter to A-D convert the main voltage output by the main D-A converter,
    wherein the calibration section
        sets the main D-A converter in a manner to output a prescribed voltage,
        adjusts the correction data to have a value that causes the output voltage to be identical to the prescribed voltage based on a comparison result obtained by comparing the output voltage of the output terminal of the D-A conversion apparatus to the prescribed voltage, and
        supplies search data instead of the correction data to the correction D-A converter and changes the search data supplied to the correction D-A converter to detect the search data through which the output voltage and the prescribed voltage are identical, and determines the detected search data to be the correction data having the value that causes the output voltage to be identical to the prescribed voltage.

6. The D-A conversion apparatus according to claim 5, wherein
    the D-A conversion apparatus designates one or more correction target bits for each of which correction data is set, and
    the correction data output section outputs the correction data obtained by cumulatively adding one or more pieces of correction data corresponding to one or more correction target bits having a value of one from among the one or more correction target bits of the input data.

7. The D-A conversion apparatus according to claim 6, wherein the D-A conversion apparatus designates one or more upper bits of the input data as the correction target bits.

8. The D-A conversion apparatus according to claim 6, wherein the main D-A converter includes:
    a dummy capacitor having a first end thereof connected to a common potential;
    a plurality of parallel capacitors that is disposed to correspond to a plurality of bits of the input data, each parallel capacitor having a first end thereof connected to an output wire providing a connection between a second end of the dummy capacitor, which is not connected to the common potential, and the output end of the main D-A converter;

a plurality of first switches that is disposed to correspond to the plurality of bits of the input data, each first switch connecting a second end of a corresponding parallel capacitor to a reference potential or the common potential according to a value of a corresponding bit; and a plurality of second switches that is disposed to correspond to at least the correction target bits from among the plurality of bits of the input data, each second switch switching the reference potential, which is connected to a second end of a corresponding parallel capacitor, between a positive reference potential and a negative reference potential that symmetrically sandwiches the common potential with the positive reference potential.

9. The D-A conversion apparatus according to claim 8, wherein, when measuring the correction data for each correction target bit, the calibration section connects to the negative reference potential a second end of a parallel capacitor corresponding to a bit that is lower than the each correction target bit, connects to the positive reference potential a second end of a parallel capacitor corresponding to the each correction target bit, connects to the common potential a second end of a parallel capacitor corresponding to a bit that is higher than the each correction target bit, and determines the correction data for the each correction target bit based on a comparison result obtained by comparing the output voltage to the common potential.

10. An A-D conversion apparatus that outputs digital output data according to an analog input voltage, comprising:

a D-A conversion apparatus that outputs a comparison voltage according to digital comparison data;

a comparator that outputs a comparison result obtained by comparing the input voltage to the comparison voltage; and a control section that changes the comparison data supplied to the D-A conversion apparatus to detect the comparison data through which the input voltage and the comparison voltage are the same and outputs the detected comparison data as the output data, wherein the D-A conversion apparatus includes:

a capacitance array main D-A converter that supplies a main voltage according to the comparison data to an output terminal of the D-A conversion apparatus;

a correction data output section that outputs correction data according to the comparison data;

a capacitance array correction D-A converter that outputs a correction voltage according to the correction data; and a voltage dividing capacitor connected serially between an output end of the correction D-A converter and an output end of the main D-A converter, the main D-A converter includes:

a dummy capacitor having a first end thereof connected to a common potential;

a plurality of parallel capacitors that is disposed to correspond to a plurality of bits of the input data, each parallel capacitor having a first end thereof connected to an output wire providing a connection between a second end of the dummy capacitor, which is not connected to the common potential, and the output end of the main D-A converter;

a plurality of first switches that is disposed to correspond to the plurality of bits of the input data, each first switch connecting a second end of a corresponding parallel capacitor to one of a reference potential and the common potential according to a value of a corresponding bit; and one or more serial capacitors disposed on the output wire so as to be connected in series to each other, the plurality of parallel capacitors are arranged such that the parallel capacitors corresponding to higher bits are connected to the output wire closer to the output end of the main D-A converter, a particular parallel capacitor has a capacitance identical to a synthetic capacitance of one or more serial capacitors, the dummy capacitor, and one or more parallel capacitors that are connected to the output wire at positions of bits lower than the particular parallel capacitor, and two or three parallel capacitors are connected to the output wire between two adjacent serial capacitors, between the dummy capacitor and one of the serial capacitors, and between one of the serial capacitors and the output end of the main D-A converter.

11. An A-D conversion apparatus that outputs digital output data according to an analog input voltage, comprising:

a D-A conversion apparatus that outputs a comparison voltage according to digital comparison data;

a comparator that outputs a comparison result obtained by comparing the input voltage to the comparison voltage; and a control section that changes the comparison data supplied to the D-A conversion apparatus in order to detect the comparison data through which the input voltage and the comparison voltage are the same and outputs the detected comparison data as the output data, wherein the D-A conversion apparatus includes:

a main D-A converter that supplies a main voltage according to the comparison data to an output terminal of the D-A conversion apparatus;

a correction data output section that outputs correction data according to the comparison data;

a correction D-A converter that outputs a correction voltage according to the correction data;

an adding section that adds the correction voltage to the main voltage; and a calibration section that determines the correction data during calibration based on a result obtained by A-D converting the main voltage output by the main D-A converter by means of the correction D-A converter, wherein the calibration section sets the main D-A converter in a manner to output a prescribed voltage, adjusts the correction data to have a value that causes the output voltage to be identical to the prescribed voltage based on a comparison result obtained by comparing the output voltage of the output terminal of the D-A conversion apparatus to the prescribed voltage, and supplies search data instead of the correction data to the correction D-A converter and changes the search data supplied to the correction D-A converter to detect the search data through which the output voltage and the prescribed voltage are identical, and determines the detected search data to be the correction data having the value that causes the output voltage to be identical to the prescribed voltage.

12. A D-A conversion apparatus that outputs an analog output voltage according to digital input data, comprising:
- a capacitance array main D-A converter that supplies a main voltage according to the input data to an output terminal of the D-A conversion apparatus;
- a correction data output section that outputs correction data according to the input data;
- a capacitance array correction D-A converter that outputs a correction voltage according to the correction data; and
- a voltage dividing capacitor connected serially between an output end of the correction D-A converter and an output end of the main D-A converter,
- wherein the correction D-A converter and the voltage dividing capacitor have a synthetic capacitance equal to the synthetic capacitance of the correction D-A converter multiplied by two raised to a power.

13. An A-D conversion apparatus that outputs digital output data according to an analog input voltage, comprising:
- a D-A conversion apparatus that outputs a comparison voltage according to digital comparison data;
- a comparator that outputs a comparison result obtained by comparing the input voltage to the comparison voltage; and
- a control section that changes the comparison data supplied to the D-A conversion apparatus to detect the comparison data through which the input voltage and the comparison voltage are the same and outputs the detected comparison data as the output data, wherein
the D-A conversion apparatus includes:
- a capacitance array main D-A converter that supplies a main voltage according to the comparison data to an output terminal of the D-A conversion apparatus;
- a correction data output section that outputs correction data according to the comparison data;
- a capacitance array correction D-A converter that outputs a correction voltage according to the correction data; and
- a voltage dividing capacitor connected serially between an output end of the correction D-A converter and an output end of the main D-A converter, and the correction D-A converter and the voltage dividing capacitor have a synthetic capacitance equal to the synthetic capacitance of the correction D-A converter multiplied by two raised to a power.

* * * * *